United States Patent
Boppana et al.

(10) Patent No.: US 6,938,223 B2
(45) Date of Patent: Aug. 30, 2005

(54) LOGIC CIRCUIT HAVING A FUNCTIONALLY REDUNDANT TRANSISTOR NETWORK

(75) Inventors: Vamsi Boppana, Santa Clara, CA (US); Debashis Bhattacharya, Plano, TX (US)

(73) Assignee: Zenasis Technologies, Inc., Campbell, CA (US)

( * ) Notice: Subject to any disclaimer, the term of this patent is extended or adjusted under 35 U.S.C. 154(b) by 0 days.

(21) Appl. No.: 10/076,809

(22) Filed: Feb. 15, 2002

(65) Prior Publication Data

US 2002/0162078 A1 Oct. 31, 2002

Related U.S. Application Data

(60) Provisional application No. 60/269,006, filed on Feb. 15, 2001.

(51) Int. Cl.[7] .............................. G06F 17/50; G06F 7/38
(52) U.S. Cl. ....................... 716/1; 716/2; 716/5; 716/7; 708/232
(58) Field of Search .............................. 716/1, 23, 5, 7; 708/232

(56) References Cited

U.S. PATENT DOCUMENTS

| | | | | | |
|---|---|---|---|---|---|
| 4,551,514 | A | * | 11/1985 | Rohn | 708/232 |
| 4,625,310 | A | * | 11/1986 | Mercer | 714/724 |
| 4,792,909 | A | * | 12/1988 | Serlet | 716/10 |
| 6,301,687 | B1 | * | 10/2001 | Jain et al. | 716/3 |
| 2002/0053063 | A1 | * | 5/2002 | Bhattacharya et al. | 716/1 |
| 2004/0015799 | A1 | * | 1/2004 | Jain | 716/5 |

OTHER PUBLICATIONS

M. Berkelaar et al., Efficient Orthonormality Testing for SYnthesis with Pass–Transistor Selectors, Proceedings of the IEEE/ACM Int'l Conference on Computer Aided Design, pp. 256–263, Dec. 1995.*

C. Nielsen, Evaluation of Function Books for Asynchronous Design, Proceedings of the Conference on European Design Automation, pp. 454–459, Sep. 1994.*

Kazuo Taki, "A Survey for Pass–Transistor Logic Technologies", IEEE, 1998.

Mineo Kaneko and Jianlin Tian, "Concurrent Cell Generation and Mapping for CMOS Logic Circuits", IEEE, 1997.

* cited by examiner

Primary Examiner—A. M. Thompson
(74) Attorney, Agent, or Firm—Ohlandt, Greeley, Ruggiero & Perle, L.L.P.

(57) ABSTRACT

A method and system for constructing, designing, and using a family of logic circuits based on methods of interconnecting transistors (or more generally, switches). The method includes the selective use of functionally redundant transistors to achieve target objectives, such as speed of operation, power dissipation, control over switching capacitances, noise characteristics and signal integrity. In accordance with the present invention, multiple topologies may be incorporated into the implementation of a single dynamic transistor topology. The logic circuit family provides flexibility by implementing different topologies for the various functionally redundant sub-networks of transistors. The method is applicable to any network of transistors whose characteristics depend, at least in part, on its implementation topology.

44 Claims, 20 Drawing Sheets

NAND GATE WITH DIFFERENT TRANSISTOR STACK ORDERING, $z=(abc)'$

NAND GATE WITH FUNCTIONALLY REDUNDANT TRANSISTORS, z=(abc)'

| Cell( nand) / Pin-Name | T(fall) | T(rise) | N(fall) | N(rise) |
|---|---|---|---|---|
| A | 0.130 | 0.100 | 2.267 | 1.600 |
| B | 0.140 | 0.110 | 2.267 | 1.733 |
| C | 0.150 | 0.120 | 2.133 | 1.733 |
| D | 0.120 | 0.090 | 2.267 | 1.600 |
| E | 0.100 | 0.080 | 2.267 | 1.600 |
| F | 0.080 | 0.070 | 2.267 | 1.467 |

*FIG. 16*

| Cell( nand) / Pin-Name | T(fall) | T(rise) | R(fall) | R(rise) |
|---|---|---|---|---|
| A | 0.100 | 0.170 | 1.200 | 1.733 |
| B | 0.110 | 0.190 | 1.067 | 1.733 |
| C | 0.070 | 0.130 | 1.200 | 1.733 |
| D | 0.090 | 0.150 | 1.067 | 1.600 |
| E | 0.070 | 0.120 | 1.200 | 1.600 |
| F | 0.050 | 0.090 | 1.200 | 1.600 |

*FIG. 17*

```
INPUT (n7.0)
INPUT (l_g_array_0__16)
U218_Z = OR (n7.0, _g_array_0__16)
INPUT (_pog_array_4__15)
INPUT (n218)
U1_4_4_15_int_node_2 = AND (pog_array_4__15_, n218)
INPUT (_g_array_4__16_)
U1_4_6_15_int_node_1 = OR (U1_4_4_15_int_node_2, _g_array_4__15_)
U1_4_4_18_ZN = NOT (U1_4_4_15_int_node_1)
SUM_16_ = XOR (U218_Z, U1_4_4_15_ZN)
OUTPUT (SUM_16_)
```

FIG. 18

| Call( real ) / Pin-Name | T(fall) | T(rise) | R(fall) | R(rise) |
|---|---|---|---|---|
| n70 | 0.260 | 0.330 | 8.667 | 12.000 |
| _g_array_0__16_ | 0.260 | 0.340 | 9.333 | 12.000 |
| _pog_array_4__15_ | 0.080 | 0.100 | 6.000 | 12.000 |
| n218 | 0.040 | 0.030 | 4.000 | 7.333 |
| _g_array_4__15_ | 0.210 | 0.240 | 7.333 | 12.000 |
| n70_BAR | 0.260 | 0.330 | 8.667 | 12.000 |
| _g_array_0__16__BAR | 0.260 | 0.340 | 9.333 | 12.000 |
| _pog_array_4__15__BAR | 0.080 | 0.100 | 6.000 | 12.000 |
| n218_BAR | 0.040 | 0.030 | 4.000 | 7.333 |
| _g_array_4__15__BAR | 0.210 | 0.240 | 7.333 | 12.000 |

FIG. 19

| Cell( real) / Pin-Name | T(fall) | T(rise) | R(fall) | R(rise) |
|---|---|---|---|---|
| n70 | 0.310 | 0.400 | 11.333 | 14.667 |
| _g_array_0__16_ | 0.320 | 0.410 | 11.333 | 14.667 |
| _pog_array_4__15_ | 0.170 | 0.260 | 10.667 | 15.333 |
| n218 | 0.130 | 0.150 | 10.667 | 12.667 |
| _g_array_4__15_ | 0.120 | 0.070 | 6.667 | 7.333 |
| n70_BAR | 0.310 | 0.400 | 11.333 | 14.667 |
| _g_array_0__16__BAR | 0.320 | 0.410 | 11.333 | 14.667 |
| _pog_array_4__15__BAR | 0.170 | 0.260 | 10.667 | 15.333 |
| n218_BAR | 0.130 | 0.150 | 10.667 | 12.667 |
| _g_array_4__15__BAR | 0.120 | 0.070 | 6.667 | 7.333 |

FIG. 20

| Cell( real) / Pin-Name | T(fall) | T(rise) | N(fall) | N(rise) |
|---|---|---|---|---|
| n70 | 0.530 | 0.390 | 8.667 | 7.333 |
| _g_array_0__16_ | 0.260 | 0.410 | 5.333 | 7.333 |
| _pog_array_4__15_ | 0.200 | 0.190 | 8.667 | 8.000 |
| n218 | 0.080 | 0.080 | 5.333 | 5.333 |
| _g_array_4__15_ | 0.170 | 0.130 | 6.667 | 6.667 |
| n70_BAR | 0.530 | 0.390 | 8.667 | 7.333 |
| _g_array_0__16__BAR | 0.260 | 0.410 | 5.333 | 7.333 |
| _pog_array_4__15__BAR | 0.200 | 0.190 | 8.667 | 8.000 |
| n218_BAR | 0.080 | 0.080 | 5.333 | 6.333 |
| _g_array_4__15__BAR | 0.170 | 0.130 | 6.667 | 6.667 |

FIG. 21

EACH SUB-NETWORK MAY EVEN BE A MULTI-LEVEL IMPLEMENTATION.

LOGIC CIRCUIT HAVING A FUNCTIONALLY REDUNDANT TRANSISTOR NETWORK

This application claims priority of U.S. Provisional Patent Application Ser. No. 60/269,006 filed on Feb. 15, 2001,

BACKGROUND OF THE INVENTION

1. Field of the Invention

The present invention pertains to digital logic circuits and, in particular, to a method and system for designing digital logic circuits containing functionally redundant transistor networks used to design ICs (integrated circuits).

2. Description of the Related Art

Integrated circuit technology represents the core of electronic engineering technology. Transistors form the basic components from which ICs are fabricated. Several basic techniques for placing and interconnecting transistors are known. The most popular and effective technologies are based on MOS (metal oxide semiconductor) technology. Several logic families have been developed for digital logic design based on underlying MOS fabrication technology, such as, for example, CMOS (complementary metal oxide semiconductor), NMOS, and PMOS. Each example logic family has advantages and disadvantages.

As a matter of contextual background, a brief review of existing logic families will be presented. The most popular logic family is based on CMOS technology. CMOS logic can be divided into static CMOS and dynamic CMOS logic families. Static CMOS is the most popularly used logic family.

Static logic circuitry is characterized by the fact that a global signal, namely a clock, is not used to synchronize the circuit. The output is solely a function of the input of the circuit, and is asynchronous with respect to the input. The timing of the circuit is defined exclusively by the static logic circuit's internal delay.

In dynamic logic, the output is synchronized by a global signal, viz. the clock. Thus, the output is a function of both the circuit's input(s) and the circuit's clock signal. That is, the timing of the circuit is defined both by the circuit's internal delay and the timing of the clock. Dynamic logic circuits typically operate faster than their static logic counterparts because their switching is based on dynamic charge storage.

Logic families, such as static CMOS, are comprised of both static and dynamic logic. Static CMOS is the type of logic most often referred to when static logic is discussed. Static CMOS is the most popular family of logic for the design of digital ICs. Static CMOS circuits typically have the same number of NMOS and PMOS transistors, wherein the n and p branches are duals of each other. An exemplary generic network structure of the static CMOS logic family is shown in FIG. 1.

It is noted that the generic network 100 includes a PMOS branch 5, a NMOS branch 10, inputs 15, an output 20, a ground connection 25, and a power connection 30. Static logic is fast, does not dissipate power in the steady state, and has good noise margin characteristics. It has a pull-up network which is implemented using, for example, PMOS transistors and a pull-down network which is implemented using NMOS transistors. Additional examples of static CMOS logic networks are shown in FIGS. 2 and 3.

FIG. 2 shows an exemplary CMOS circuit 200 for the function z=(abc)', including PMOS branch 205 and NMOS branch 210. FIG. 3 illustrates a static CMOS circuit 300 for the function z=(a(b+c))'. Circuit 300 includes PMOS branch 305 and NMOS branch 310.

Pseudo-NMOS logic is cited herein for historical reasons. Pseudo-NMOS is not fast, it dissipates static power in a steady state (i.e., when the output is in the low state), and is sensitive to noise. It is an evolution of NMOS logic and is obtained by substituting an entire PMOS branch in a static logic implementation with a single PMOS transistor having its gate connected to ground so that the PMOS transistor is always conducting and leads the output node to the high state. If the ratio between the NMOS and PMOS transistor is well designed, the NMOS branch also conducts, thereby causing the output to discharge.

Dynamic logic families have a common characteristic, namely, the dynamic logic needs a pre-charge (or pre-discharge) transistor to lead some pre-charged nodes to a known state. The precharge (or pre-discharge) is accomplished during a pre-charge phase or memory phase of operation. During another phase of operation, the evaluation phase, the output has a stable value.

Some of the more popular and widely used dynamic logic families include Domino Logic, N-P Domino Logic/Zipper Logic, Clocked CMOS logic, NO RAce logic (NORA), and Pass-Transistor Logic (PTL). A generic domino logic network 400 is shown in FIG. 4. During the pre-charge phase of operation, the clock 405 is low so that the pre-charged node 410 before the static inverter 415 is high, and the output (Z) is low. During the evaluation phase, clock 405 is high so that the inputs of n-block 420 can discharge the pre-charged node 410 and lead the output (Z) to the high state. N-block 420 can be configured to perform any logical function. For example, an AOI (And-Or-Invert) gate 500 implemented using domino logic as shown in FIG. 5.

Several domino logic gates can be cascaded since each gate has its own output inverter, every gate can be driven with the same clock signal, and the evaluation phase lasts the time necessary for all of the gates to finish their input evaluation.

Moreover, domino logic has a limited area occupancy due to low number of PMOS transistors therein. However, it is not possible to implement inverting-structures and, as with all other dynamic logics, domino logic is subject to charge-sharing problems.

N-P domino logic, or zipper logic, as shown by a generic example thereof in FIG. 6, is an evolved version of domino logic. The logic blocks of this logic family alternate between NMOS and PMOS networks. The pre-charge and evaluate transistors are fed from the clock 635 and clockbar 40. It should be appreciated that the functions of the top and bottom transistors also alternate between pre-charge and evaluate.

This type of logic has a lower area occupancy since there is no need for a static inverter, however it also has a lower operating speed due to the presence of PMOS transistors.

Clocked CMOS logic is another dynamic logic family. A typical clocked CMOS gate is basically a three-state gate wherein when the clock is at a low state, the output is floating at the high impedance state. Clocked CMOS logic is principally used as a dynamic latch, as an interface between static logics and dynamic-pipelined logics.

NO RAce logic (NORA) is an evolution of N-P domino logic. The static inverter of domino logic is substituted with a clocked CMOS inverter. Since the output stage of every cell is also dynamic (i.e., a CMOS inverter), the NORA logic is more susceptible to charge-sharing problems than conventional domino logic Pass-transistor logic (PTL) exploits the basic ability of a transistor to conditionally transmit information based on a condition at the gate, and the voltages at the drain and source terminals of the transistor can be brought to a similar level. In typical PTL designs, some transistors have neither their gate, source nor drain terminals connected to either the supply voltage or ground. Hence, PTL suffers from losses in signal strength and is typically not applied in environments where noise margins are critical.

A key problem with conventional logic families is that their properties critically depend on the topology of the underlying transistor network implementations defining the logic family. Differing topologies offer different design choices when implementing a transistor network. However, it is often desirable to have an implementation that provides the benefits of multiple topologies.

As an example, consider a static CMOS circuit wherein improved fall-time characteristics from multiple input pins to the output pin of the CMOS circuit is desired. With reference to circuit 200, let the target timing objective be to minimize the fall-time delay at node Z due to a transition at either node A or node B.

In general, the fall-time at Z caused by input transitions of transistors close to Z (as opposed to transistors closer to the ground node 225) is better than the fall-time at Z due to input transitions occurring at transistor inputs closer to the ground node 225. Note, this condition is not always guaranteed across all possible semiconductor fabrication processes and, other influencing sub-networks may be present. However, herein it is assumed that the transistors are all of the same type and size. Therefore, in the present example, the fall transition for the pin-pair A–Z is better than the fall transition for the pin-pair B–Z. If it is desired that the fall transition from B–Z be faster, the same network functionality (i.e., z=(abc)') can be implemented with an alternative topology as shown in FIG. 7. However, if it is a design objective that both the A–Z and B–Z transitions be fast using the same IC logic topology, then conventional logic families do not offer a clear solution.

CMOS circuits are often designed with larger-sized PMOS gates where a balance is desired between rise time delays caused by PMOS transistors and fall time delays caused by NMOS transistors in order to account for the slower switching times of PMOS transistors, as compared to NMOS transistors. Some recent IC designs propose balancing the rise and fall times of simple NAND and NOR gates. Such suggested methods, however, rely on an ad hoc addition of transistors to arrive at balanced rise and fall times for the simple gates. Therefore, such proposed methods are clearly applicable only for simple gates, and there exists no systematic method or system for constructing or identifying such structures having balanced rise and fall times using simplified gates and/or more complex gates.

SUMMARY OF THE INVENTION

The present invention offers a solution to the aforementioned and other problems by providing a method and system for incorporating multiple transistor topologies into the implementation of a single transistor network. The present invention uses at least one functional redundancy to achieve a desired design objective. In accordance with the present invention, a generic transistor structure capturing a functional redundancy is identified. The identified functionally redundant network(s) may range from the introduction of a single functionally redundant transistor to creating a functionally redundant transistor network based on an entirely orthogonal functional decomposition of the target function.

Thus, the present invention pertain to a new family of transistor-based logic circuits based on methods of interconnecting transistors, and more generally, switches. The method of the present invention employs the selective use of functionally redundant transistors in order to achieve target objectives, such as, for example, speed of operation, power dissipation, control over switching capacitances, noise characteristics, signal integrity, etc.

BRIEF DESCRIPTION OF THE DRAWINGS

FIG. 16 is an exemplary tabular listing the timing characteristics for topology with preference for transition F–Z;

FIG. 17 is an exemplary tabular listing the timing characteristics for topology with preference for both transitions F–Z and C–Z;

FIG. 18 is an exemplary coded specification for a target complex function with 5 inputs and 1 output;

FIG. 19 is an exemplary tabular listing for the timing characteristics for a topology with preference for transitions n218-SUM__16__ and __pog__array__4__15__-SUM__16__;

FIG. 20 is an exemplary tabular listing for the timing characteristics for a topology with preference for transitions __g__array__4__15__-SUM__16__ and __n218-SUM__16__;

FIG. 21 is an exemplary tabular listing for the timing characteristics for a topology with preference for transitions _g_array_4_15_-SUM_16_, n218-SUM—16_ and _POG_array_4_15_-SUM_16 _.

DETAILED DESCRIPTION OF THE INVENTION

Figure 1:
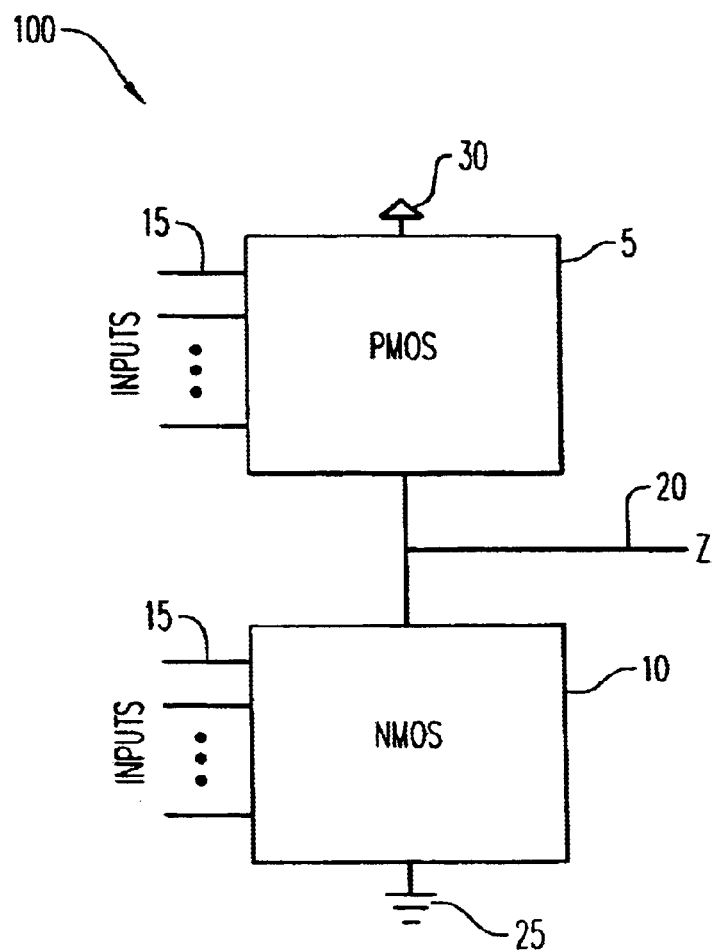
FIG. 1 is an exemplary schematic representation of a generic static CMOS circuit.
Figure 2:
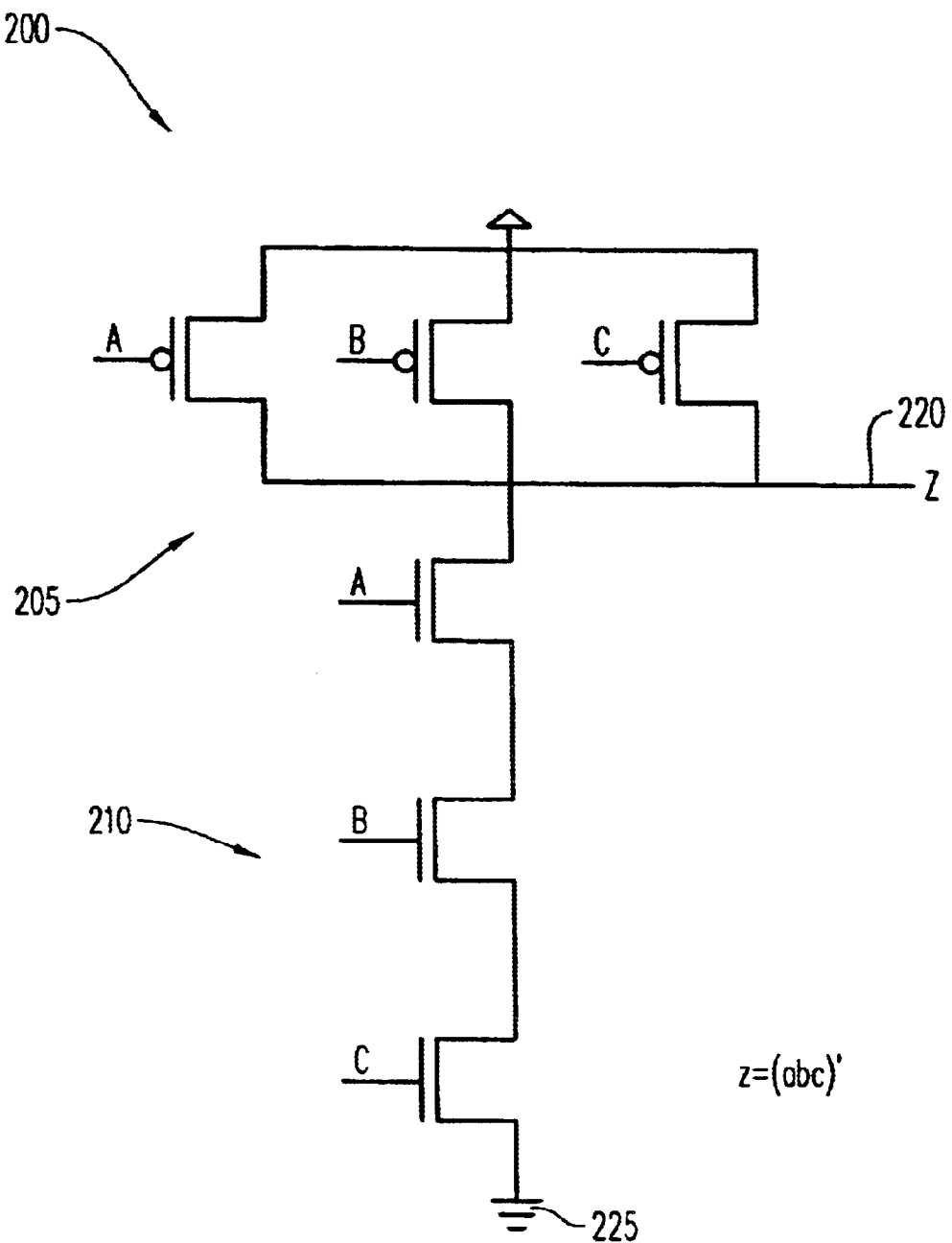
FIG. 2 is an exemplary schematic representation of a static CMOS circuit, where z=(abc)'.

The present invention pertains to a new logic family for digital logic circuits based on the selective use of functionally redundant transistor configurations. Various configurations of functionally redundant transistor networks and a method based on functional decomposition for identifying and implementing functionally redundant transistor networks is presented herein.

In accordance with the present invention, a dynamic topology of transistors is formed from logic circuits having functionally redundant logic circuits to achieve specific target objectives.

Functionality for both simple gates and complex gates can be implemented by the logic family of the present invention. "Simple" gates implement the basic Boolean functionality of AND, OR, AND, NOR, NOT. "Complex" gates implement complex Boolean functionality, including interconnections of a multitude of simple Boolean gates. The implementation of complex gates may require a combination of one or more series and parallel networks of transistors.

Target objectives can include specific input-output timing characteristics of the transistor network, specific power dissipation constraints of the transistor network, specific signal integrity constraints of the transistor network, specific noise constraints of the transistor network, constraints on charging/discharging of internal and effective load and drive capacitances of the transistor network, desirable reduced dependence of the target objectives on the topological ordering of the transistors in the stack, and various other constraints specified on the transistor network.

In accordance with the present invention, functionally redundant transistors can include a single transistor introduced at an appropriate position in the transistor network, and/or an entire series or parallel network(s) of transistors added to the original network, while preserving the desired functionality of the transistor network is preserved. Functionally redundant transistor networks may be obtained from alternative minterm covers of the target function and/or from alternative functional decompositions of the target function.

In an aspect of the present invention, the functional decomposition may consist of either flat or multi-level transistor networks. Multi-level transistor sub-networks may further include functionally redundant transistor networks. In an aspect of the present invention, the position of the introduced transistors or transistor sub-networks in the logic family of the present invention can be located near (i.e., close) to an input, an output, a supply or a around node of a logic function.

The present invention provides a method for systematically obtaining target objectives, such as, but not limited to, better timing using the addition of redundant transistor structures based on functional decomposition, ordering and sizing of the transistor network. The method can be used to achieve objectives on transistor logic families for which topology is important. Such transistor logic families can include, for example, static CMOS, domino, zipper, clocked CMOS, and PTL logic.

As the example circuits will show, target objectives (e.g., timing improvements) are achievable based on implementing the desired functionality in terms of redundant transistor networks. While some of the examples discussed herein are based on producing functionally redundant variations of static CMOS circuits, it should be appreciated by those skilled in the art that the present invention encompasses other logic circuit families by extension.

Figure 12:
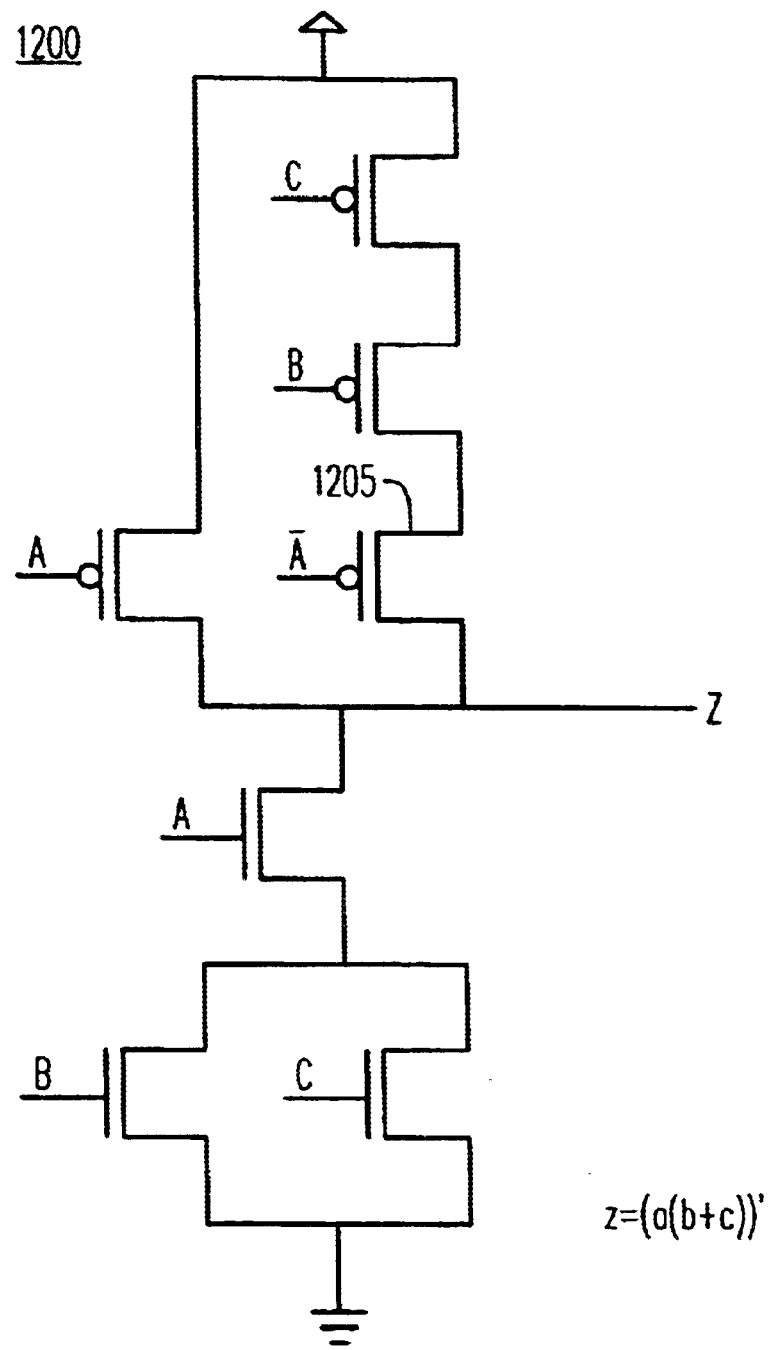
FIG. 12 is an exemplary schematic representation of an AOI gate with a single redundant transistor added to one of the p-stacks, where z=(a(b+c))'.

Referring back to FIG. 3, the AOI gate 300 is implemented with a single redundant transistor. However, a functionally redundant transistor can be added to the PMOS network 305 in order to control the switching capacitances and hence, timing and other effects of the network. FIG. 12 is an implementation of an AOI circuit using a single, functionally redundant transistor 1205 in accordance with the present invention. Thus, by the addition of functionally redundant transistor 1205, characteristics of circuit 1200 can be controlled, while maintaining the functionality of circuit 1200. Functionally redundant transistors can be added to the PMOS network in order to control the switching capacitances and hence, timing and other effects of the network. That is, circuit 300 and 1200 are each an implementation of the function z=(a(b+c))'.

Figure 8:
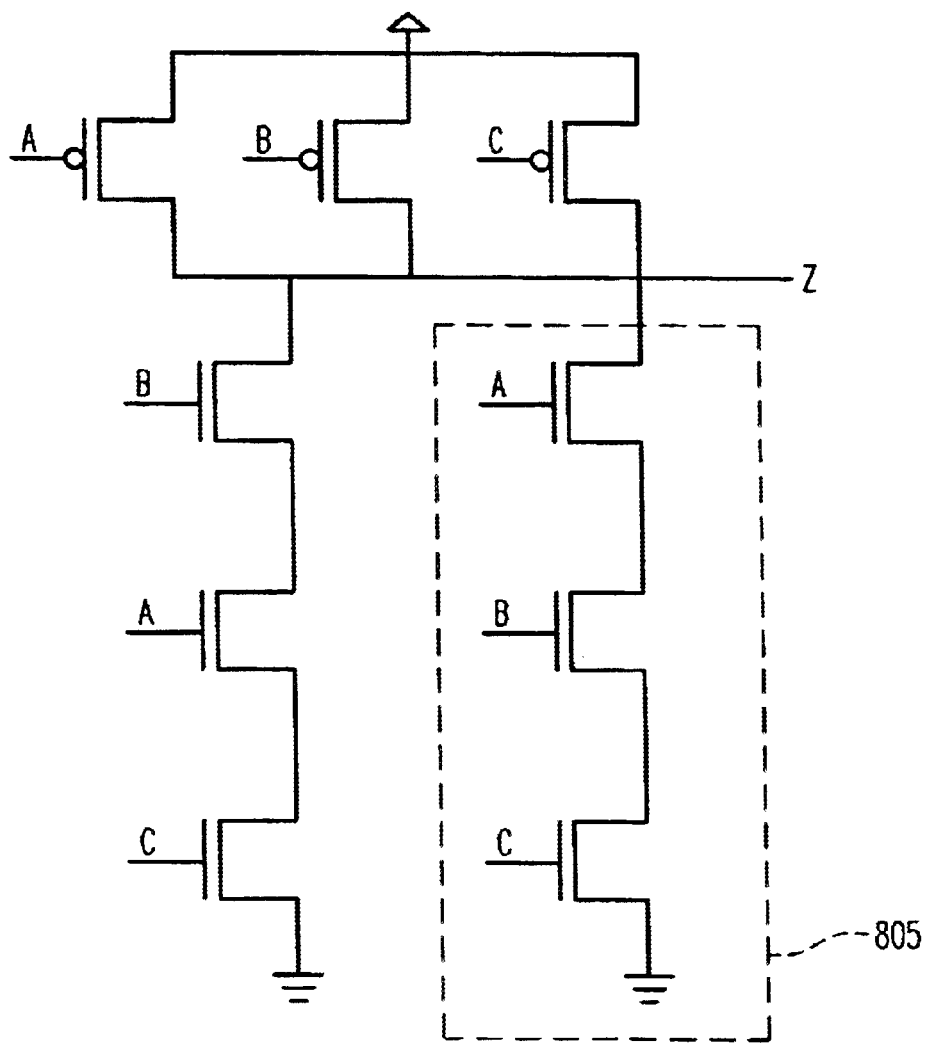
FIG. 8 is an exemplary schematic representation of a Nand gate with functionally redundant transistors, where z=(abc)'.

FIG. 8 is an example of a NAND gate functionally equivalent to circuit 200, implemented using multiple chains of redundant transistors 805. In accordance with the present invention, it can be demonstrated that the addition of functionally redundant chains of transistors may include not only simple gate topologies as shown in exemplary circuit 800, but may also include complex functions.

Figure 3:
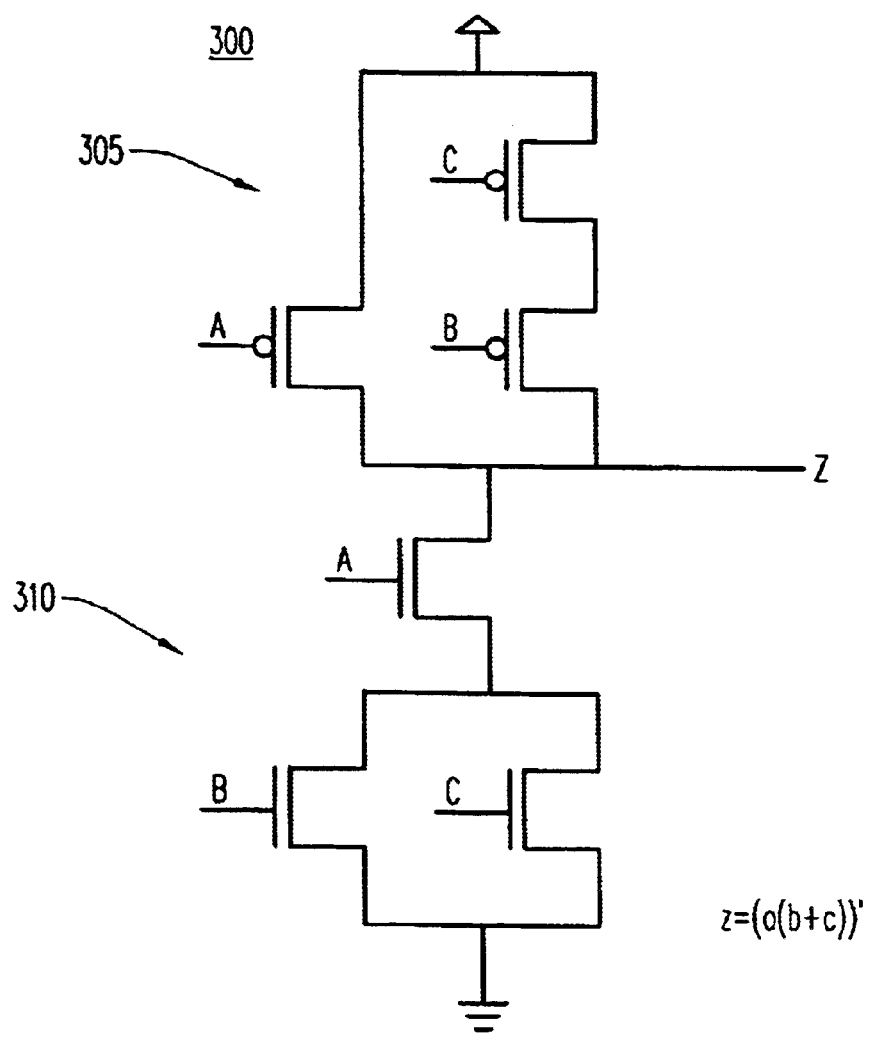
FIG. 3 is an exemplary schematic representation of a static CMOS circuit, where z=(a(b+c))'.
Figure 4:
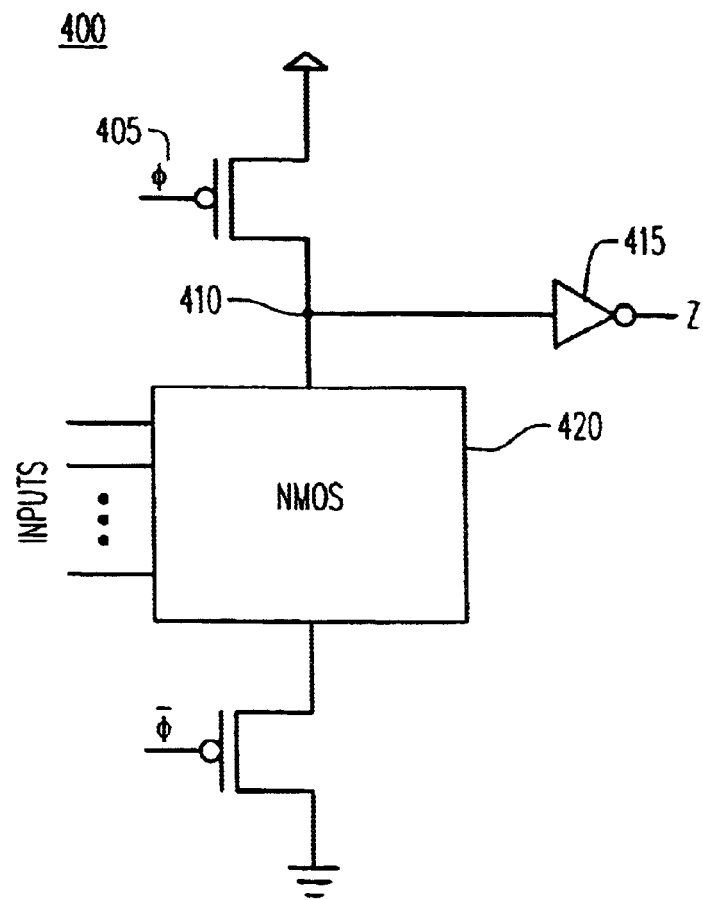
FIG. 4 is an exemplary schematic representation of a generic domino logic circuit.
Figure 5:
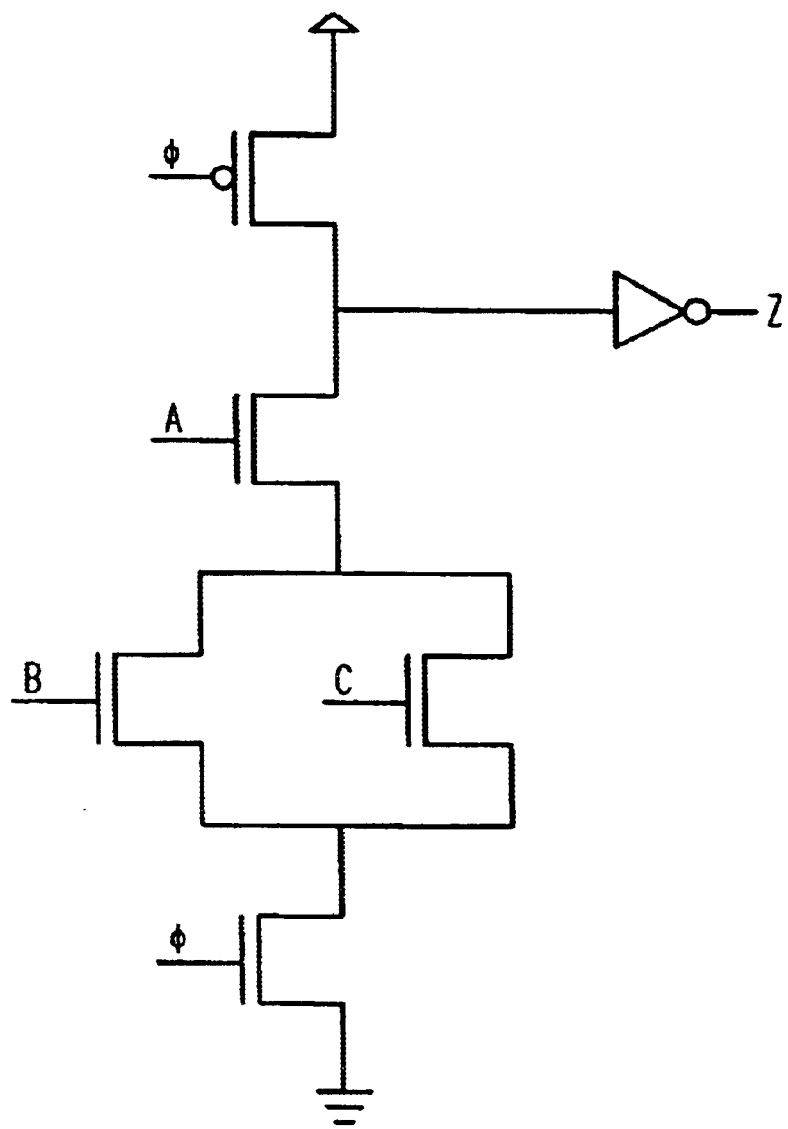
FIG. 5 is an exemplary schematic representation of a domino logic circuit.
Figure 6:
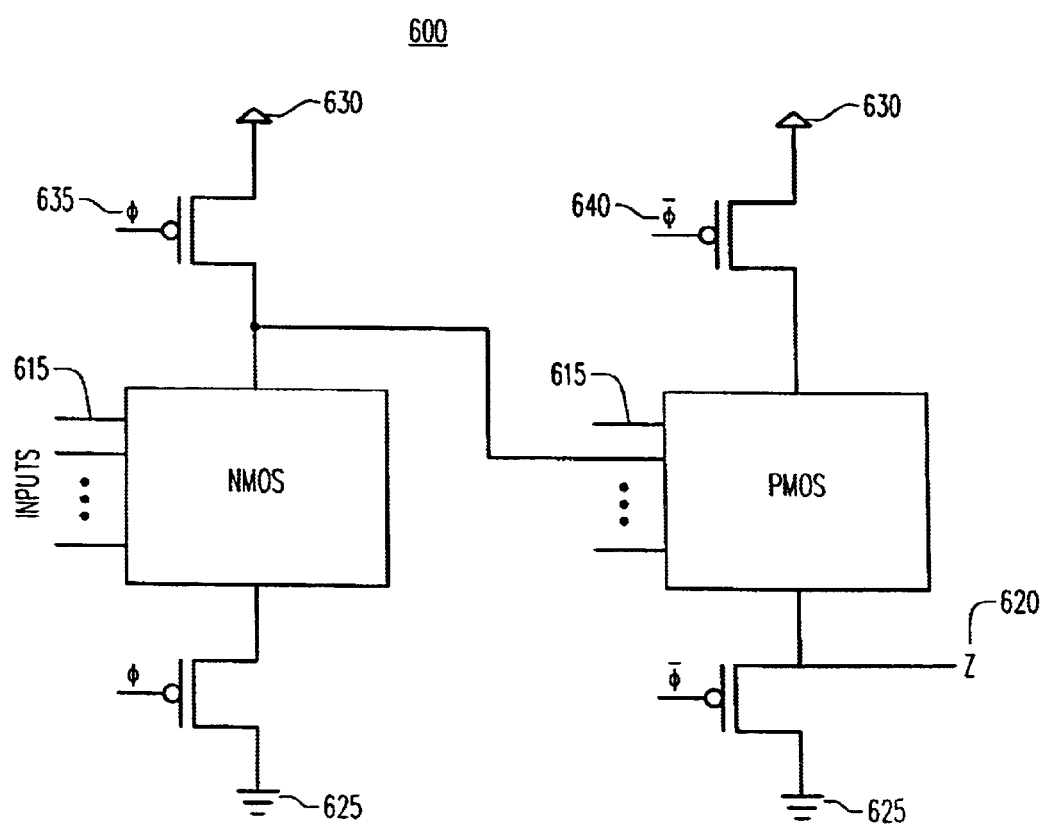
FIG. 6 is an exemplary schematic representation of a generic N-P/zipper logic circuit.
Figure 7:
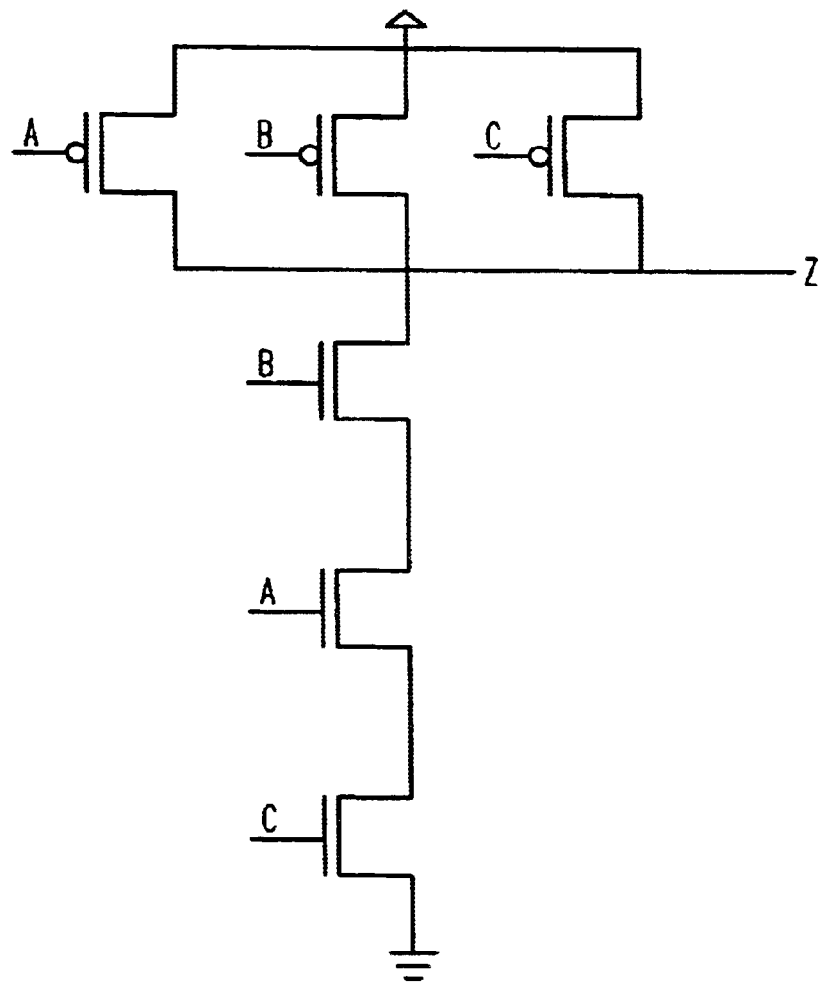
FIG. 7 is an exemplary schematic representation of a Nand gate with different transistor stack ordering than that depicted in FIG. 2, where z=(abc)'.

The simplified yet illustrative example of circuit 1200 for implementing the AOI gate introduced in FIG. 3 is presented for purposes of clarity and conciseness in illustrating various aspects of the present invention, and not as a limit of the invention.

It should be note that the topology of FIG. 3 is ideal for fall transitions from input pin A to output Z (i.e., A–Z), but may not be ideal for a fall transition from B–Z or C–Z based on the location of inputs A, B, and C. It is seen that the function, $$f(a,b,c)=(a(b+c))'$$

can also be expressed as, $$f(a,b,c)=(a(b+c)+ba+ca)'$$

Figure 9:
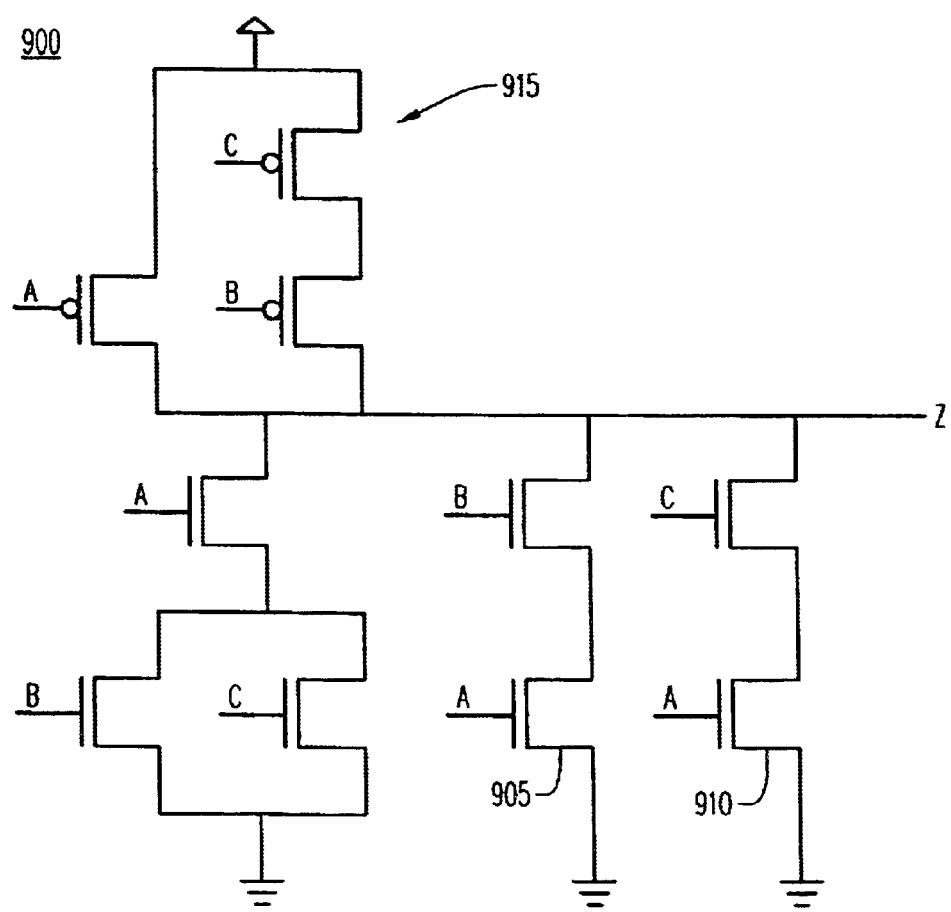
FIG. 9 is an exemplary schematic representation of an AOI gate with two functionally redundant stacks added on the n-side, where z=(a(b+c))'.

Thus, it is clear that two more functionally redundant chains of transistors, corresponding to the minterms "ba" and "ca", may be added to transistor network 300 without altering the functionality of the circuit. FIG. 9 illustrates a modification of circuit 300, including the addition of functionally redundant transistor stacks "ba" 905 and "ca" 910 to create the AIO gate shown in circuit 900.

Figure 10:
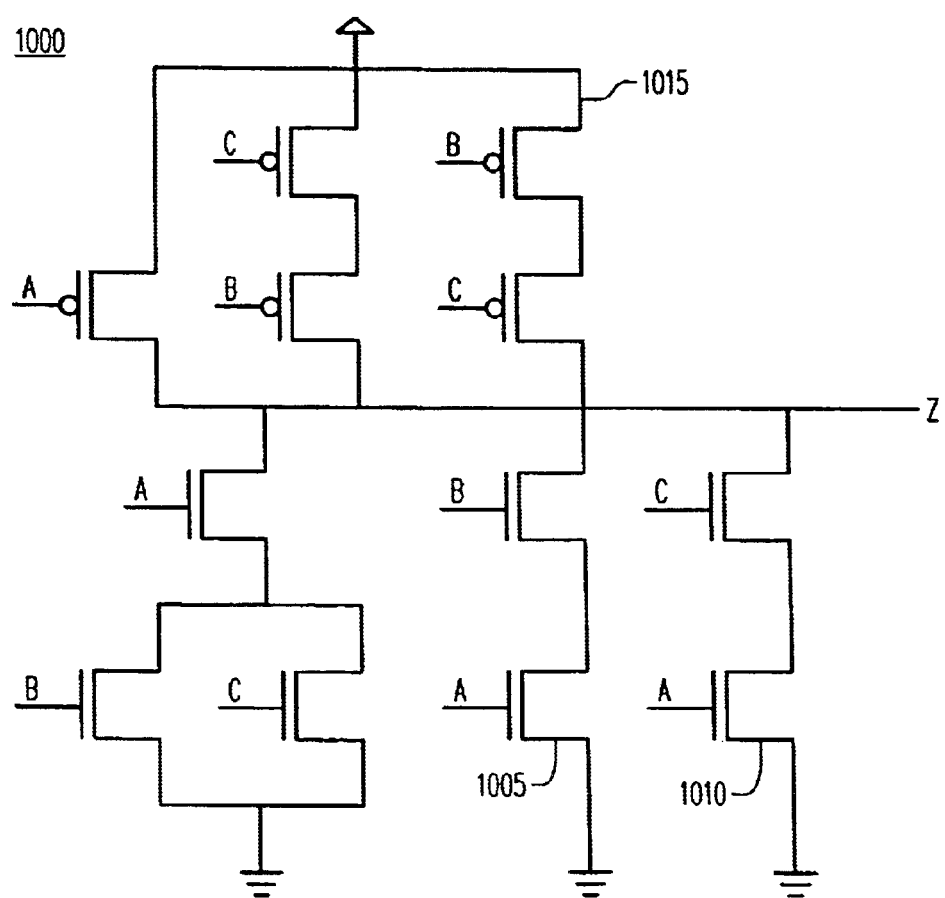
FIG. 10 is an exemplary schematic representation of an AOI gate with two functionally redundant stacks added on the n-side and one functionally redundant stack added on the p-side, where z=(a(b+c))'.

Further, note that in circuit 900, the rise time from pin C to pin Z (i.e., C–Z) may be slower than that of pin B to pin Z (i.e., B–Z). This deficiency can be addressed by applying the concept of functional redundancy to the PMOS sub-network 915 in accordance with the present invention. The resulting, functionally equivalent logic circuit is shown in FIG. 10. Circuit 1000 is an implementation of the AOI function of circuit 900, including the addition of functionally redundant transistor stack "bc" on the p-side. The functionality, z=(a(b+c)), of circuit 900 is maintained in circuit 1000.

The above examples clearly illustrate that the addition of functional redundant transistors, including a single transistor and/or a chain of transistors, can be derived from constructing and manipulating the target Boolean functions in the context of considering the final design objectives, such as, but not limited to, timing.

The functionally redundant networks of transistors utilized by the present invention may be obtained by functional decomposition of the target Boolean function. Boolean functions can be decomposed into sub-functions based on several different criteria. Several decomposition methods used in the field of digital logic circuit design include, but are not limited to, Boole-Shannon, Kronecker, Positive Davio, Negative Davio, Roth-Karp, and Ashenhurst decomposition.

For example, using Boole-Shannon decomposition, a given Boolean formula can be decomposed into two orthogonal (i.e., their on-sets are disjoint) sub-functions based on the selection of a decomposition variable. For example, the function f shown below can be decomposed based on the variable a, such that, $$f(a,b,c)=a.g(b,c)+a'.h(b,c)$$

Similarly, the function f can be decomposed based on any of its input variables, such that, $$f(a,b,c)=b.i(a,c)+b'.j(a,c)$$

$$f(a,b,c)=c.k(a,b)+c'.l(a,b)$$

The ability to decompose Boolean functions in multiple ways is useful in the creation of functionally redundant transistor networks used by the present invention. Each decomposition of the function can be implemented in terms of a specific transistor network topology. As discussed above, characteristics (e.g., timing and delay) of an implemented digital function are affected by the topology used to implement the function. Therefore, the characteristics of the networks implemented from the decompositions depend, at least in part, on the topology of the logic family used. The multiple decompositions and network topologies preferably used provide flexibility for designing ICs that satisfy target logic circuit objectives.

Disjoint topologies derived from a decomposition of the Boolean function can be integrated into a single, dynamic, topology based on the basic Boolean property, $$f=f+f.$$

Each orthogonal decomposition of the Boolean function can suggest a specific topology or topologies that are ideal (or more suited) for implementing the function. For example, a decomposition of the AOI gate in terms of the variable "a", results in the transistor network 300 shown in FIG. 3. Two other decompositions based on the variables b ((ba+ac)') and c ((ca+ab)') suggest alternative transistor chains as implemented in the transistor networks 900 and 1000 of FIGS. 9 and 10, respectively.

Again, FIG. 9 is a schematic representation of an AOI gate with two functionally redundant stacks 905 and 910 added on the n-side, where z=(a(b+c))'. FIG. 10 is that AOI gate having two functionally redundant stacks added on the n-side, 1005 and 1010, and one functionally redundant stack 1015 added on the p-side as shown.

In an aspect of the present invention, the addition of a transistor(s) or transistor chain(s) based on orthogonal decompositions/covers of the function can be extended to include a consideration of multiple decompositions of a logic function. For example, an original decomposition based on the variable "a" and the transistor network implemented therefrom can be further represented by a transistor network based on a consideration of all possible Boole-Shannon decompositions of the function. To reiterate, other decomposition methods may be used.

Figure 11:
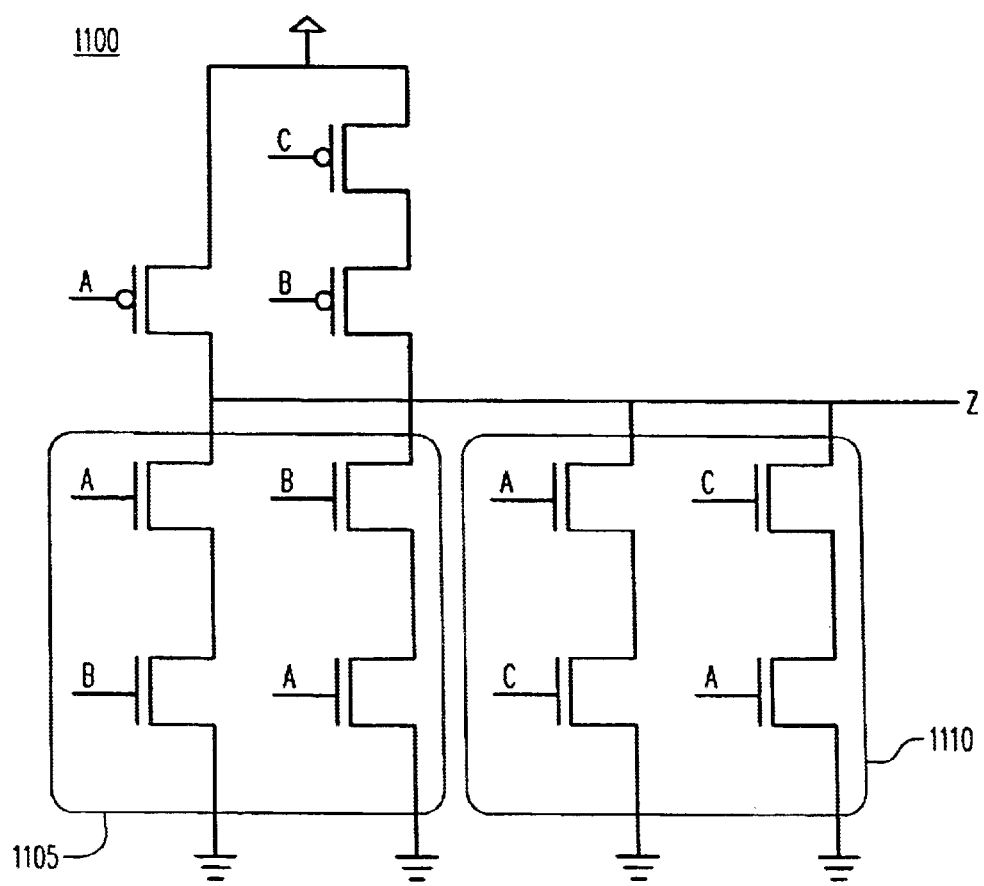
FIG. 11 is an exemplary schematic representation of an AOI gate implementation based on implementing sub-networks based on orthogonal functional decomposition, where z=(a(b+c))'.

An example of a circuit configuration based on implementing sub-networks based on orthogonal function decompositions is illustrated in FIG. 11. It should be appreciated that circuit 1100 can be made irredundant by eliminating one of the two transistor chain sub-networks 1105, 1110. FIG. 11 shows an AOI gate, z=(a(b+c))', implementation having sub-networks 1105 and 1110 based on orthogonal functional decompositions.

Figure 13:
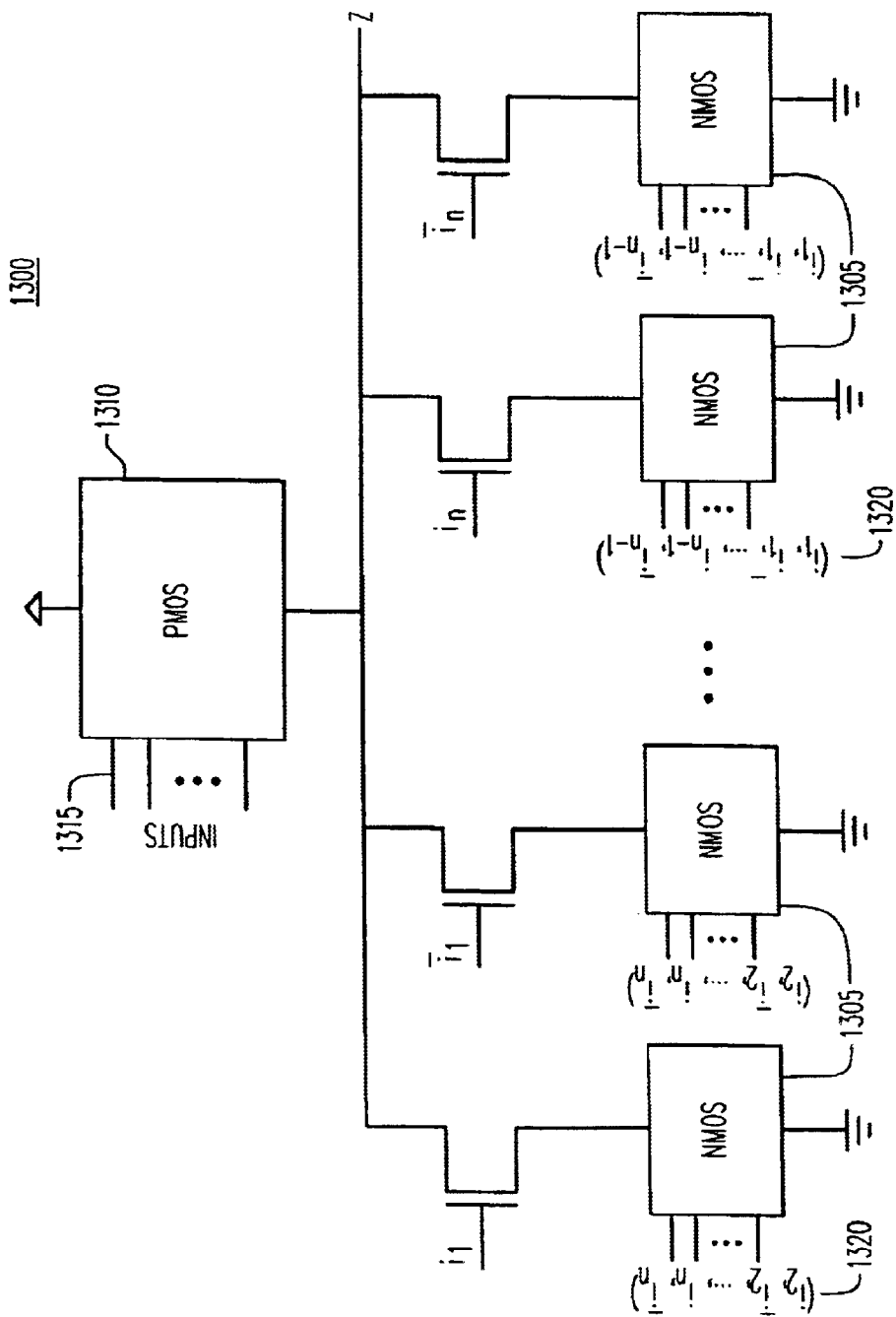
FIG. 13 is an exemplary schematic representation of a logic circuit including a logic family in accordance with the present invention on the n-side of a CMOS circuit.

Accordingly, and based on multiple, orthogonal, Boole-Shannon decompositions of a function, the implementation of an exemplary NMOS transistor network in accordance with the present invention may generally be represented as illustrated in circuit 1300 of FIG. 13. Circuit 1300 includes a PMOS network 1310 having inputs 1315 and multiple, orthogonal Boolean-Shannon decompositions implemented as NMOS networks 1305 having inputs 1320.

Figure 14:
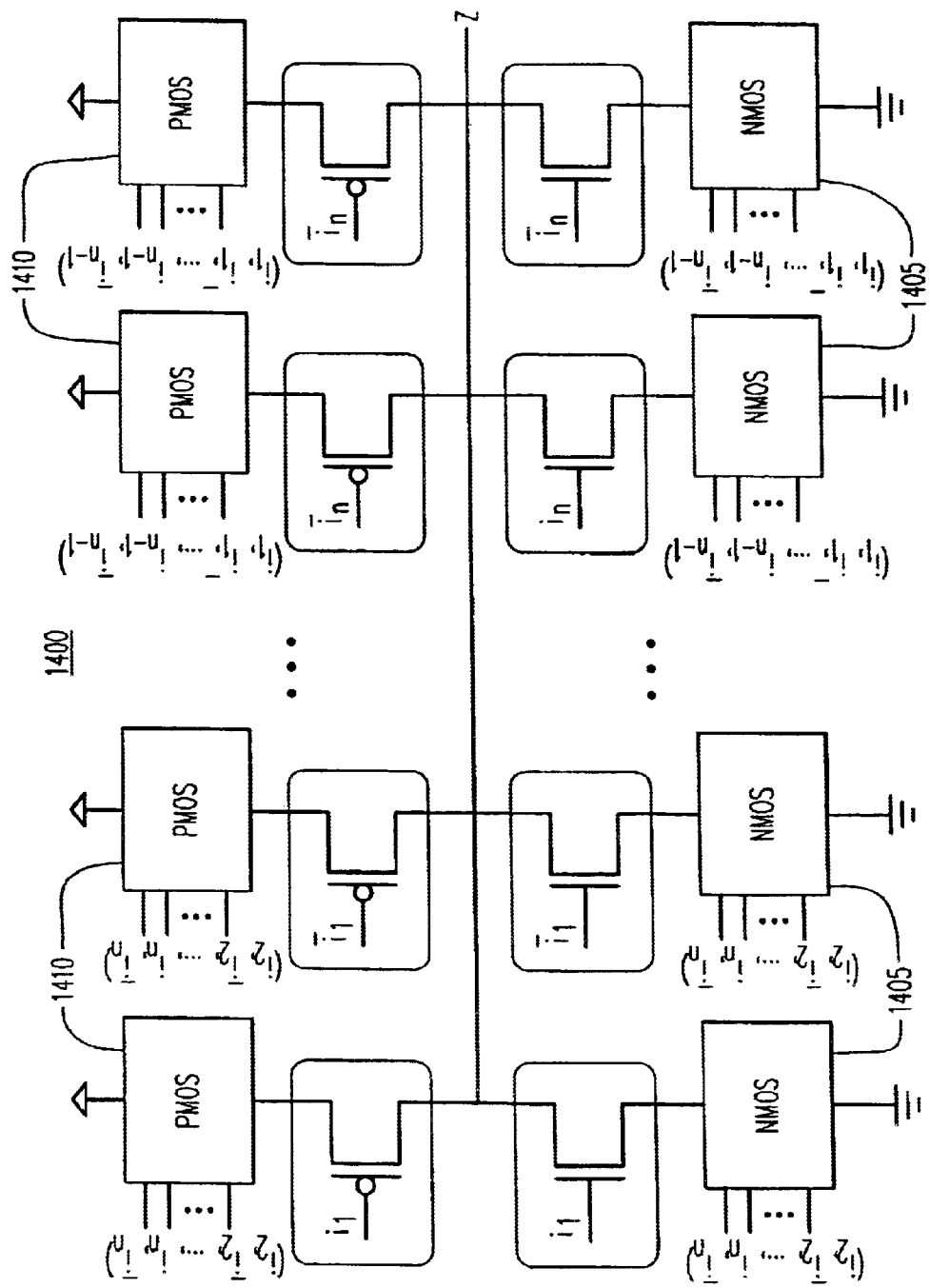
FIG. 14 is an abstraction of a logic circuit including a logic family in accordance with the present invention on the n-side and p-side of a CMOS circuit.

Furthermore, if functional redundancy is introduced on both the PMOS 1310 and NMOS network portions of a circuit 1300, the logic family of the present invention has the general structure as shown in circuit 1400 of FIG. 14. Thus, the AOI gate f=(a(b+c))' implemented in FIG. 10 may be represented by a variety of implementations in accordance with the teachings of the present invention using functionally redundant transistor(s) (i.e., switches), chains of transistor(s), and sub-networks as illustrated in the abstraction, circuit 1400.

Circuit 1400 may contain a plurality functionally redundant sub-networks 1405 and 1410 on the n-side and p-side, respectively. The topology of sub-networks 1405 and 1410 may be varied in order to achieve the desired operating characteristics and target functionality Z for circuit 1400. That is, the topology of the sub-networks 1405, 1410 are not necessarily fixed.

Figure 15:
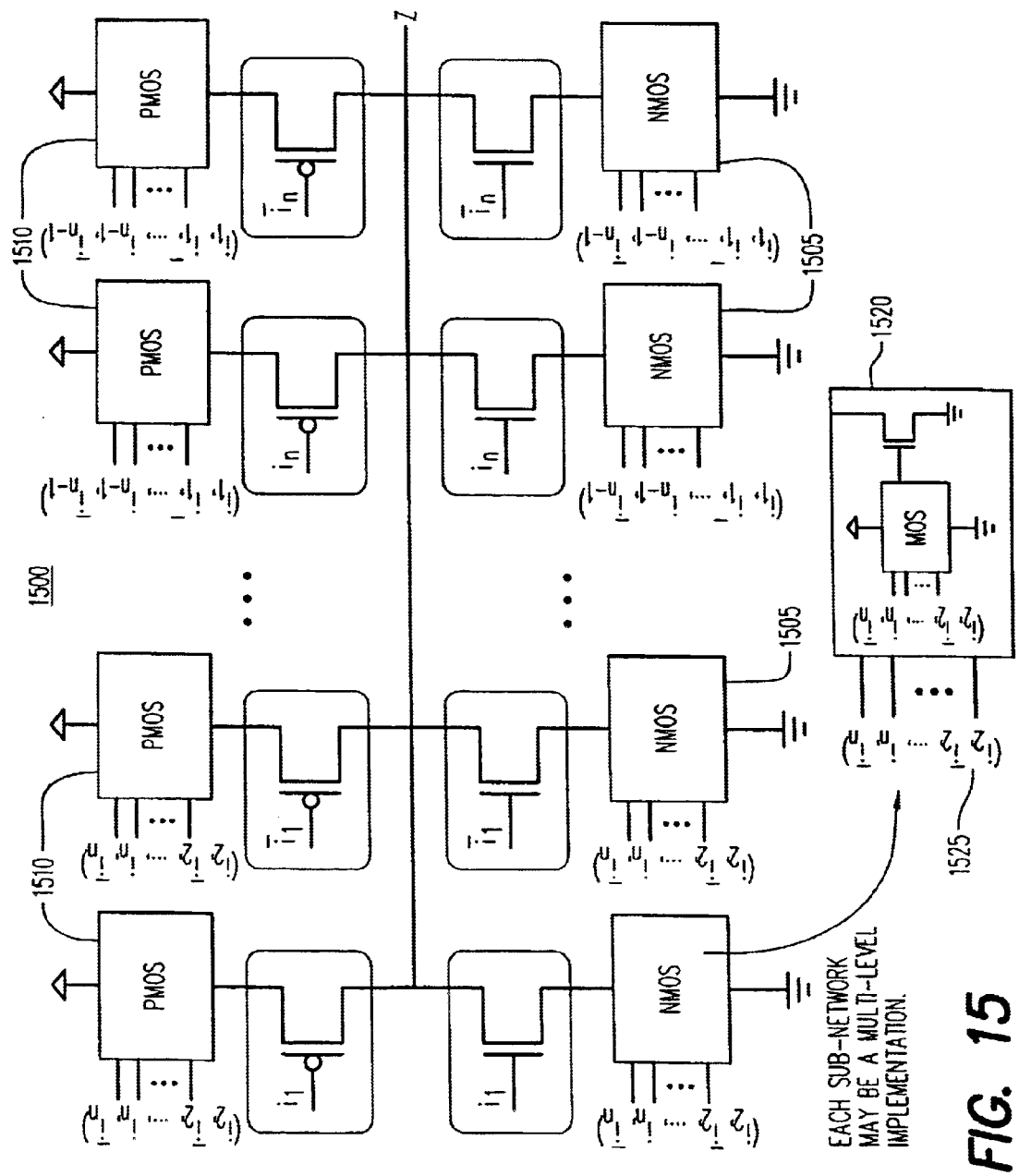
FIG. 15 is an abstraction of a logic circuit including a logic family in accordance with the present invention having multi-level sub-networks on both the n-side and p-side of a CMOS circuit.

In an aspect of the present invention, sub-networks of the logic family taught herein can be hierarchical as illustrated in FIG. 15. The hierarchical sub-networks 1505 and 1510 may include functional redundancy, for example, in the form of multi-level implementations thereof as shown in circuit 1500 wherein sub-network 1520 is a multi-level logic circuit implementation.

Figure 22:
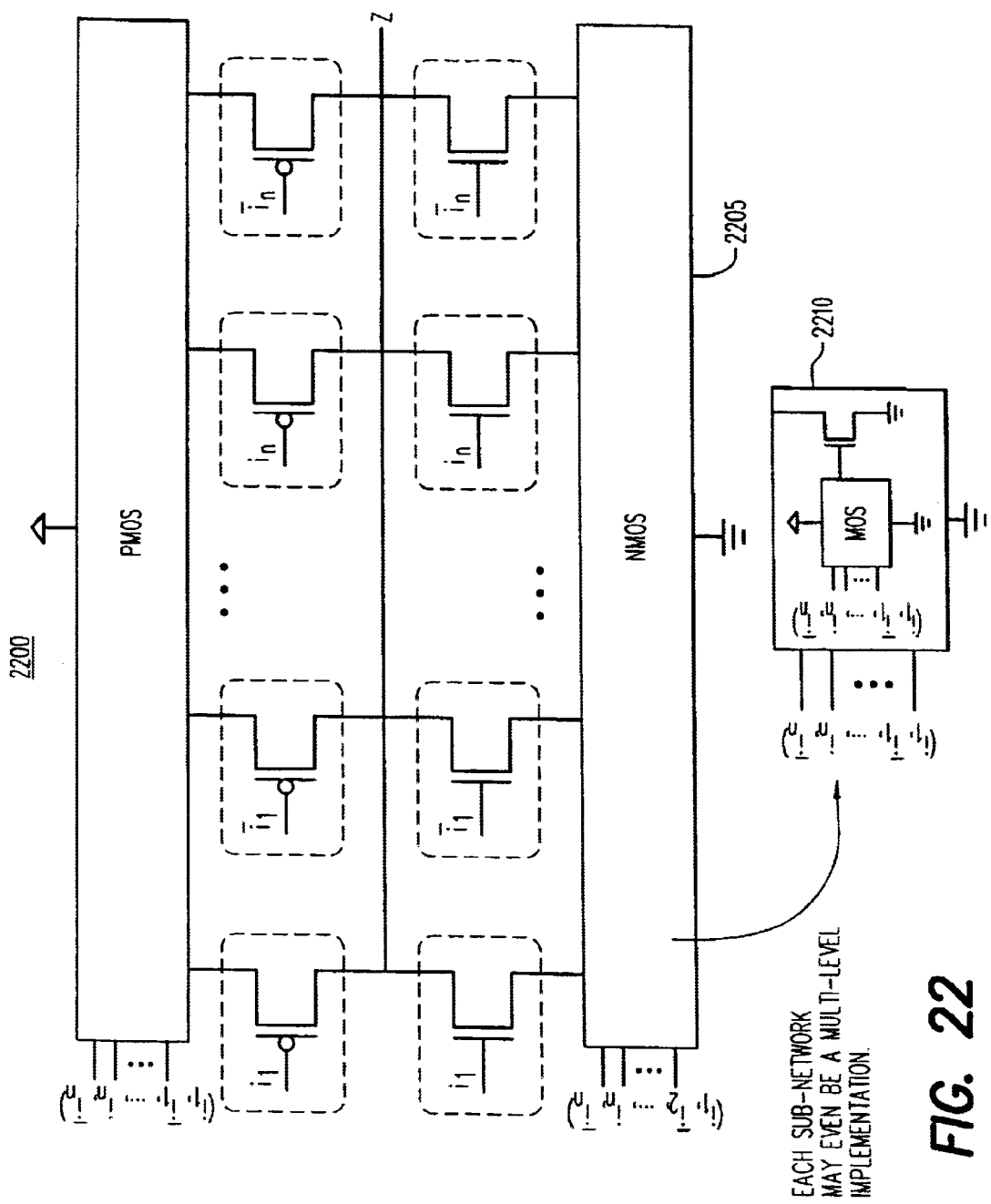
FIG. 22 is an abstraction of a logic circuit including a logic family in accordance with the present invention having multi-level sub-networks on both the n-side and p-side of a CMOS circuit.

In another aspect of the present invention, sub-networks (e.g., NMOS and PMOS sides of a CMOS logic circuit) can share transistor sub-networks. That is, the individual decomposed transistor chains may not all be disjoint. An exemplary abstraction of a CMOS circuit 2200 that illustrates this aspect of the present invention is shown in FIG. 22 wherein NMOS sub-network 2205 has transistor sub-networks as shown at 2210.

It is further noted that the multiple decompositions and resulting transistor networks realized and utilized by the present invention may be based on one or more forms or methods of decomposition, including but not limited to, the forms of decomposition introduced earlier.

In an aspect hereof, the position (i.e., transistor ordering) of the transistors corresponding to a decomposition variable are not necessarily fixed in the positions depicted in the exemplary circuits discussed herein. Therefore, the positioning of the circuitry for implementing the decompositions in the exemplary circuits are illustrative, and not a limitation of the present invention Accordingly, and in furtherance of the advantageous benefits of the present invention, the decompositions can be placed in a transistor chain at positions appropriate to achieve the desired target objectives of the logic circuit.

In an aspect of the present invention, one or more transistor sub-networks obtainable by alternative decompositions may be absent from the final, implemented resultant logic circuit formed in accordance with the present invention if doing so benefits achieving the target objective(s). In other words, a subset of the transistor networks derived from an exploration of multiple decompositions may be used, and thus implemented in the resultant target logic circuit. Furthermore, each transistor in a logic circuit transistor network can be optimally selected and sized to meet the desired target objectives.

In another aspect of the present invention, it is noted that certain function forms offer better transistor networks based on properties such as, but not limited to, unateness. A function f has an unate decomposition in terms of the variable "a", if the function can be expressed as, $$f(a,b,c)=a \cdot g(b,c)+h(b,c)$$

In this example, the transistor network corresponding to the variable a' can result in a sub-network implementing the function h(b,c). However, based on the principle of functional redundancy, an implementation that includes the transistor a' may be based on the following variation of the decomposition of function f:

$$f(a,b,c)=a \cdot (g(b,c)+h(b,c))+a'h(b,c)$$

For a desired target objective of timing, the criteria of, for example, (1) arrival times on input signals; (2) target arrival time on the output signals; (3) drive strength restriction on each input signal; and (4) drive strength restriction on each output signal can be considered and used in implementing the functionally redundant transistor network(s) of the present invention. It should be appreciated that other target objectives and criteria may be considered and that the timing objective is but one example.

In an aspect of the present invention, a preferred method for selecting the implemented configuration of a transistor network depends on multiple methods of decomposition and an estimation of the desired target characteristics based on the results achieved by simultaneously using multiple topologies for implementing the logic circuit. Example results demonstrating the use of functionally redundant transistors for achieving a target objective (e.g., timing improvement) are provided to illustrate this aspect of the present teachings. The target objective of improved pin-pin timing on selected input-output pins and how the addition of functional redundancy is useful for achieving timing improvements is demonstrated.

As an example, and with respect to a multi-chain NAND gate implementation, consider a six-input NAND gate (e.g., Z=(ABCDEF)'), implemented with a single chain. FIG. 16 provides a timing report for the NAND gate. The topology chosen for the exemplary chain is FEDABC. As shown in the timing report, the fall transition from F–Z is the fastest (0.08 ns) for this topology. Note that the fall transition from C–Z (0.15 ns) is the slowest for this topology.

If the target objective is to improve timing on the C–Z transition without making the existing (fast) F–Z transition slower, the two chains of transistors on the NMOS network can be combined to obtain a functionally redundant transistor network as shown in FIG. Indeed, doing so results in improved timing for both the F–Z transition (0.05 ns) and the C–Z transition (0.07 ns) in a functionally redundant transistor implementation as indicated in the table listing of FIG. 17.

As another example, consider improving timing of a logic circuit wherein the implemented function is a complex function. The functionality of the complex function is shown in terms of basic Boolean operations as illustrated by the coded specification of FIG. 18. The specified function has five inputs and one output. The target objective for this function is to enable fast fall transitions from pins n218-SUM_16_ (e.g., delay less than 0.1 ns) and _g_array_4_15_-SUM_16 (e.g., delay less than 0.2 ns).

First, an implementation of the transistor network specified in FIG. 18 with a topology that satisfies the transition n218-SUM_16_ is examined. The timing results are shown in FIG. 19. The intrinsic delay on a fall transition from n218 to SUM_16_ is 0.04 ns but from _g_array_4_15_-SUM_16 is only 0.21 ns. This topology clearly violates the target constraint_g_array_4_15_.

Next, consider an alternative topology that is most suitable for _g_array_4_15_. The timing results obtained from the alternative topology for implementing the functionality specified in FIG. 18 are shown in FIG. 20. The intrinsic delay on a fall transition from _g_array_4_15_-SUM_16 improves to 0.12 ns and the transition from n218 to SUM_16_ is 0.13 ns.

Both of the timing target constraints can be satisfied however using functional redundancy by combining the orthogonal decompositions based on the logic circuit structure of the present invention as shown in FIG. 15. The resulting timing obtained using the topology of FIG. 15 is shown in FIG. 21. The delay on a fall transition from n218 to SUM_16_ is 0.08 ns and from _g_array_4_15_-SUM_16 is 0.17 ns. This topology meets the required constraints.

In one aspect of the present invention, there is a system for designing a logic circuit, comprising means for specifying a logic function for the logic circuit, means for identifying a design objective for the logic function and means for implementing the logic circuit by selectively using at least one functionally redundant transistor network, the implemented logic circuit achieving the logic function and the design objective.

The system may further comprise means for decomposing the logic function into at least one functional decomposition, means for determining at least one functionally redundant transistor network implementation for the functional decomposition, and means for implementing the logic circuit by selectively using the at least one functionally redundant transistor network of the functional decomposition, the implemented logic circuit achieving the logic function and the design objective. Also, the decomposition can comprise a plurality of orthogonal sub-functions based on a selection of a decomposition variable. The determining comprises considering at least one transistor network topology for implementing the at least one functionally redundant transistor network. In the system the decomposing comprises, preferably, obtaining a functional decomposition of the logic function into at least one sub-function of the logic function.

The decomposing is preferably accomplished using a plurality of decomposition methods. The design objective is preferably selected from a group consisting of: an input-output timing characteristic, a power dissipation characteristic, a signal integrity characteristic, a specific noise characteristic, a charging/discharging characteristic of internal and effective load and drive capacitance, and a reduced dependence of said target objective on a topological ordering of transistors.

The functionally redundant transistor network preferably comprises a single redundant transistor. The functionally redundant transistor network preferably comprises a plurality of redundant transistors. The sub-functions preferably comprise a flat or a multi-level transistor network.

The implementing of the target logic function preferably comprises arranging the at least one functionally redundant transistor network based on a plurality of logic family topologies.

Regarding the system, the placement of the at least one functionally redundant transistor network is preferably selectively near an input, an output, a supply, or a ground node of the logic function. The at least one functionally redundant transistor network preferably comprises a shared transistor sub-network.

The implementing achieves the objective based, preferably, on a factor selected from the group consisting of: a functional decomposition of the target logic function, a transistor ordering of the at least one functionally redundant transistor network, and a transistor sizing of the at least one functionally redundant transistor network.

The implementing preferably comprises evaluating an estimation of the design objective. The estimation preferably comprises evaluating an implementation of the logic function using a plurality of topologies.

The at least one functionally redundant transistor network preferably comprises a shared transistor sub-network.

Although described above in the context of various transistor gates and networks and various decompositions, those skilled in the art should appreciate that these are exemplary and indicative of presently preferred imbodiments of the invention, and are not to be read or construed in a limiting sense upon the present invention. For example, the systems and/or methods disclosed herein may be implemented by a computer readable storage media (e.g., CD-ROM, ROM, flash memory, etc.) having program instructions embodied therein for executing the methods of the present invention, and in turn carried out by a processing means such as a computer. Thus, while the invention has been particularly shown and described with respect to preferred embodiments thereof, it should be understood by those skilled in the art that changes in form and details may be made therein without departing from the scope and spirit of the invention and the claims appended hereto.

What is claimed is:

1. A method for designing a logic circuit, comprising:
   specifying a target logic function for said logic circuit;
   identifying a design objective for said target logic function;
   decomposing said target logic function into at least one functional decomposition, wherein said functional decomposition comprises a plurality of orthogonal sub-functions based on a selection of a decomposition variable;
   determining at least one functionally redundant transistor network implementation for said functional decomposition; and
   implementing said logic circuit by selectively using said at least one functionally redundant transistor network of said functional decomposition, wherein said implemented logic circuit achieves said target logic function and said design objective.

2. The method of claim 1, wherein said determining comprises considering at least one transistor network topology for implementing said at least one functionally redundant transistor network.

3. The method of claim 1, wherein decomposing comprises obtaining a functional decomposition of said logic function into at least one sub-function of said logic function.

4. The method of claim 1, said decomposing is accomplished using a plurality of decomposition methods.

5. The method of claim 1 wherein said design objective is selected from a group consisting of: an input-output timing characteristic, a power dissipation characteristic, a signal integrity characteristic, a specific noise characteristic, a charging/discharging characteristic of internal and effective load and drive capacitance, and a reduced dependence of said target objective on a topological ordering of transistors.

6. The method of claim 1, wherein said functionally redundant transistor network comprises a single redundant transistor.

7. The method of claim 1, wherein said functionally redundant transistor network comprises a plurality of redundant transistors.

8. The method of claim 1, wherein said sub-functions comprise a flat or a multi-level transistor network.

9. The method of claim 1, wherein implementing said logic function comprises arranging said at least one functionally redundant transistor network based on a plurality of logic family topologies.

10. The method of claim 1, wherein placement of said at least one functionally redundant transistor network is selectively near an input, an output, a supply, or a ground node of said logic function.

11. The method of claim 1, wherein said implementing achieves said design objective based on a factor selected from the group consisting of: a functional decomposition of said logic function, a transistor ordering of said at least one functionally redundant transistor network, and a transistor sizing of said at least one functionally redundant transistor network.

12. The method of claim 1, wherein said implementing comprises evaluating an estimation of said design objective.

13. The method of claim 12, wherein said estimation comprises evaluating an implementation of said logic function using a plurality of topologies.

14. The method of claim 1, wherein said at least one functionally redundant transistor network comprises a shared transistor sub-network.

15. A system for designing a logic circuit, comprising:
    means for specifying a logic function for said logic circuit;
    means for identifying a design objective for said logic function;
    means for decomposing said logic function into at least one functional decomposition;
    means for determining at least one functional redundant transistor network implementation for said functional decomposition; and
    means for implementing said logic circuit by selectively using said at least one functionally redundant transistor network of said functional decomposition, wherein said implemented logic circuit achieves said logic function and said design objective.

16. The system of claim 15, wherein said decomposition comprises a plurality of orthogonal sub-functions based on a selection of a decomposition variable.

17. The system of claim 15, wherein said determining comprises considering at least one transistor network topology for implementing said at least one functionally redundant transistor network.

18. The system of claim 15, wherein decomposing comprises obtaining a functionally decomposition of said logic function into at least one sub-function of said logic function.

19. The system of claim 15, wherein decomposing is accomplished using a plurality of decomposition methods.

20. The system of claim 15 wherein said design objective is selected from a group consisting of: an input-output timing characteristic, a power dissipation characteristic, a signal integrity characteristic, a specific noise characteristic, a charging/discharging characteristic of internal and effective load and drive capacitance, and a reduced dependence of said target objective on a topological ordering of transistors.

21. The system of claim 15, wherein said functionally redundant transistor network comprises a single redundant transistor.

22. The system of claim 15, wherein said functionally redundant transistor network comprises a plurality of redundant transistor.

23. The system of claim 15, wherein said sub-functions comprise a flat or a multi-level transistor network.

24. The system of claim 15, wherein implementing said target logic function comprises arranging said at least one functionally redundant transistor network based on a plurality of logic family topologies.

25. The system of claim 15, wherein placement of said at least one functionally redundant transistor network is selectively near an input, an output, a supply, or a ground node of said logic function.

26. The system of claim 15, wherein said implementing achieves said objective based on a factor selected from the group consisting of: a functional decomposition of said target logic function, a transistor ordering of said at least one functionally redundant transistor network, and a transistor sizing of said at least one functionally redundant transistor network.

27. The system of claim 15, wherein said implementing comprises evaluating an estimation of said design objective.

28. The system of claim 27, wherein said estimation comprises evaluating an implementation of said logic function using a plurality of topologies.

29. The system of claim 15, wherein said at least one functionally redundant transistor network comprises a shared transistor sub-network.

30. A storage medium having computer readable program instructions embodied therein which when executed by a computer designs a logic circuit, said storage medium comprising:
  program instructions for specifying a logic function for said logic circuit;
  program instructions for identifying a design objective for said logic function; and
  program instructions for implementing said logic circuit by selectively using at least one functionally redundant transistor network, wherein said implemented logic circuit achieves said logic function and said design objective.

31. The storage medium of claim 30 wherein said method further comprises:
  program instructions for decomposing said logic function into at least one functional decomposition;
  program instructions for determining at least one functionally redundant transistor network implementation for said functional decomposition; and
  program instructions for implementing said logic circuit by selectively using said at least one functionally redundant transistor network of said functional decomposition, said implemented logic circuit achieving said logic function and said design objective, wherein said program instructions for decomposition comprises a plurality of orthogonal sub-functions based on a selection of a decomposition variable.

32. The storage medium of claim 31, wherein said program instructions for determining comprises program instructions for considering at least one transistor network topology for implementing said at least one functionally redundant transistor network.

33. The storage medium of claim 32, wherein said sub-functions comprise a flat or a multi-level transistor network.

34. The storage medium of claim 31, wherein said program instructions for decomposing comprises program instructions for obtaining a functional decomposition of said logic function into at least one sub-function of said logic function.

35. The storage medium of claim 31, wherein said program instructions for decomposing comprises program instructions for using a plurality of position methods.

36. The storage medium of claim 30 wherein said design objective is selected from a group consisting of: an input-output timing characteristic, a power dissipation characteristic, a signal integrity characteristic, a specific noise characteristic, a charging/discharging characteristic of internal and effective load and drive capacitance, and a reduced dependence of said target objective on a topological ordering of transistors.

37. The storage medium of claim 30, wherein said functionally redundant transistor network comprises a single redundant transistor.

38. The storage medium of claim 30, wherein said functionally redundant transistor network comprises a plurality of redundant transistors.

39. The storage medium of claim 30, wherein said program instructions for implementing said logic function comprises arranging said at least one functionally redundant transistor network based on a plurality of logic family topologies.

40. The storage medium of claim 30, wherein placement of said at least one functionally redundant transistor network is selectively near an input, an output, a supply, or a ground node of said logic function.

41. The storage medium of claim 30, wherein said program instructions for implementing achieves said design objective based on a factor selected from the group consisting of: a functional decomposition of said logic function, a transistor ordering of said at least one functionally redundant transistor network, and a transistor sizing of said at least one functionally redundant transistor network.

42. The storage medium of claim 30, wherein said program instructions for implementing comprises program instructions for evaluating an estimation of said design objective.

43. The storage medium of claim 42, wherein said estimation comprises evaluating an implementation of said target logic function using a plurality of topologies.

44. The storage medium of claim 30, wherein said at least one functionally redundant transistor network comprises a shared transistor sub-network.

* * * * *